United States Patent
Wakimoto et al.

(10) Patent No.: US 6,812,638 B2
(45) Date of Patent: Nov. 2, 2004

(54) ORGANIC SEMICONDUCTOR DIODE

(75) Inventors: Takeo Wakimoto, Tsurugashima (JP); Kenji Nakamura, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/103,571

(22) Filed: Mar. 22, 2002

(65) Prior Publication Data

US 2002/0149010 A1 Oct. 17, 2002

(30) Foreign Application Priority Data

Mar. 26, 2001 (JP) .......................... 2001-087132

(51) Int. Cl.$^7$ ............................ B32B 19/00; H01J 1/62; H01J 63/04
(52) U.S. Cl. ..................... 313/505; 313/506; 313/509; 428/690; 428/917; 428/216
(58) Field of Search ................. 313/505–506, 313/509, 504; 428/690, 917, 216; 257/40, 103

(56) References Cited

U.S. PATENT DOCUMENTS

| | | | |
|---|---|---|---|
| 4,281,053 A | | 7/1981 | Tang |
| 4,720,432 A | * | 1/1988 | VanSlyke et al. ............ 428/457 |
| 5,942,340 A | * | 8/1999 | Hu et al. .................... 428/690 |
| 6,078,138 A | * | 6/2000 | Iketsu ........................ 313/504 |
| 6,361,885 B1 | * | 3/2002 | Chou ........................ 428/690 |
| 6,392,250 B1 | * | 5/2002 | Aziz et al. .................... 257/40 |

OTHER PUBLICATIONS

Takahashi K et al: "Three–layer organic solar cell with high–power conversion efficiency of 3.5%", Solar Energy Materials and Solar Cells, Elsevier Science Publishers, Amsterdam, NL, vol. 61, No. 4, Apr. 2000, pp. 403–416.
Petritsch K et al: "Dye–based donor/acceptor solar cells", Solar Energy Materials and Solar Cells, Elsevier Science Publishers, Amsterdam, NL, vol. 61, No. 1, Feb. 15, 2000, pp. 63–72.

* cited by examiner

Primary Examiner—Tom Thomas
Assistant Examiner—Joseph Nguyen
(74) Attorney, Agent, or Firm—Sughrue Mion, PLLC

(57) ABSTRACT

An organic semiconductor diode comprises a hole transport layer which is arranged on an anode side and formed of an organic compound having a hole transport capability, and an electron transport layer which is arranged on a cathode side and formed of an organic compound having an electron transport capability. The hole transport layer and the electron transport layer are laminated one upon another. The cathode has a work function close to or smaller than the electron affinity of the electron transport layer, while the anode has a work function larger than that of the cathode. The organic semiconductor diode exhibits nonlinear current-voltage characteristics when a voltage is applied between the hole transport layer and the electron transport layer in contact with each other.

12 Claims, 4 Drawing Sheets

------- EXAMPLE 1
———— COMPARATIVE 1

ORGANIC SEMICONDUCTOR DIODE

BACKGROUND OF THE INVENTION

1. Field of the Invention

The present invention relates to an organic semiconductor, i.e. a two-terminal element diode which exhibits a nonlinear current-voltage characteristics by the movement of electrons and holes supplied to the junction of thin films made of organic compounds having electrical characteristics different from each other.

2. Description of the Related Art

An organic electroluminescence element (hereinafter also referred to as "organic EL element") is known which makes use of electroluminescence (hereinafter also referred to as "EL") of an organic compound that emits light by injection of electric current and includes a light-emitting layer formed by a thin layer of such an organic compound. Now, an organic EL element display device formed by arranging a plurality of the above organic EL elements in a matrix form is receiving attention as a display device capable of achieving low power consumption, high display quality, and thickness reduction. As shown in FIG. 1, each organic EL element 200 is comprised of a transparent substrate 1, such as a glass plate or the like, a transparent anode electrode 201 formed on the substrate, at least one organic material layer 202 which is comprised of an electron transport layer, a light-emitting layer, and a hole transport layer, and a metal cathode electrode 203, all of which are laminated in the mentioned order. When a positive voltage is applied to the transparent anode electrode 201, and a negative voltage is applied to the metal cathode electrode 203, that is, when a direct current is caused to flow between the transparent electrode and the metal electrode, the light-emitting layer in the organic material layer 202 emits light.

The organic EL element is considered as a capacitive light-emitting element. When a direct current driving voltage for causing light emission is applied between the electrodes, an electric charge is accumulated in a capacity component. Then, when the driving voltage exceeds a light-emitting threshold voltage of the EL element, a current starts to flow in the organic material layer to cause the organic EL element to emit light at a luminous intensity approximately proportional to the current.

The organic EL element display device is a light-emitting apparatus composed of a plurality of light-emitting pixels, that is, organic EL elements, in an image display layout in which the organic EL elements are disposed at respective points of intersection of horizontal lines and vertical lines, i.e. in a so-called matrix form. An example of the method of driving the organic EL element display device is a so-called simple matrix driving method. A display apparatus based on the simple matrix driving method has a plurality of anode lines and cathode lines arranged in the form of a matrix (grid), with organic EL elements connected at respective points of the intersection of the anode lines and the cathode lines. Either of the anode lines and the cathode lines are sequentially selected at predetermined time intervals for scanning, and the other lines are driven by a drive source in synchronism with the scanning, to cause organic EL elements arranged at desired points of intersection of the lines to emit light. In this method, each organic EL element is lighted only during an access time period, and hence to increase the size of a display screen of the apparatus, a large current and a high voltage are required.

To increase the size of the display screen of the organic EL element display device, an active matrix driving method may be considered, besides the simple matrix driving method. The active matrix driving method uses a thin film transistor (TFT) arranged at each point of the intersection (of the anode lines and the cathode lines), and supplies a current to each pixel by switching operation to cause the associated organic EL element to emit light. The TFT can be formed with using an element formed by p-Si or a-Si. Further, it is also possible to form the TFT by using a MOS-FET (Metal Oxide Semiconductor Field Effect Transistor) in place of the above element. Accordingly, the active matrix driving method requires a large number of switching circuit substrates, and inorganic materials have to be laminated on substrates of the circuits. Therefore, a high temperature process is employed for manufacturing the switching circuits.

OBJECT AND SUMMARY OF THE INVENTION

To reduce the instantaneous brightness of light-emitting elements to prevent deterioration or breakdown of both of the driving methods above mentioned, it is required to apply reverse voltage to them when light is not emitted, i.e. the scanning is inhibited. Therefore, it is proposed to provide a rectifier connected in series to the light-emitting element.

Therefore, an object of the present invention is to provide an organic semiconductor diode which can be produced at a relatively low temperature, and another object of the present invention is to provide an organic EL element display device having the organic semiconductor diodes formed on a common substrate.

An organic semiconductor diode according to the present invention comprises: a hole transport layer which is arranged on an anode side and formed of an organic compound having a hole transport capability; and an electron transport layer which is arranged on a cathode side and formed of an organic compound having an electron transport capability, the hole transport layer and the electron transport layer being laminated one upon another, wherein the cathode has a work function close to or smaller than the electron affinity of the electron transport layer, while the anode has a work function larger than that of the cathode, whereby the organic semiconductor diode exhibits nonlinear current-voltage characteristics when a voltage is applied between the hole transport layer and the electron transport layer in contact with each other.

In another aspect of the present invention of the organic semiconductor diode, said hole transport layer is formed of a porphyrin derivative.

In a further aspect of the present invention of the organic semiconductor diode, said electron transport layer is formed of a perylene derivative.

DETAILED DESCRIPTION OF THE PREFERRED EMBODIMENTS

The present invention will now be described in detail with reference to the drawings showing embodiments thereof.

Figure 1:
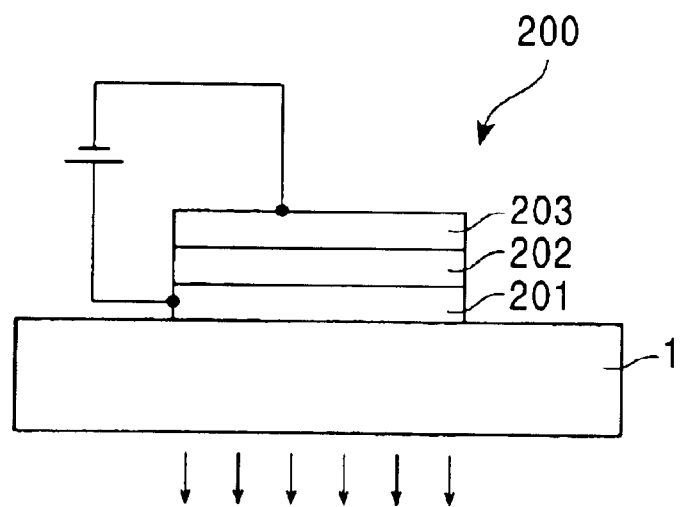
FIG. 1 is a sectional view schematically showing the construction of an organic EL element.
Figure 2:
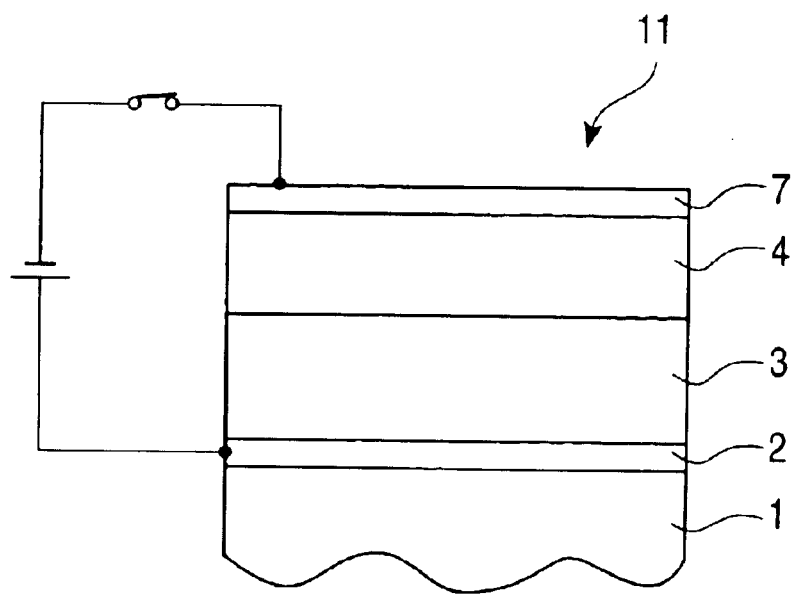
FIG. 2 is a sectional view schematically showing the construction of an organic semiconductor diode.

FIG. 2 shows an organic semiconductor diode according to an embodiment. As shown in the figure, the organic semiconductor diode 11 includes an insulating substrate 1 of glass or the like, an anode 2 formed on the insulating substrate 1, a hole transport layer 3 which is formed of an organic compound, an electron transport layer 4 which is formed of an organic compound, the hole transport layer 3 and the electron transport layer 4 having formed on the anode 2 such that they are in contact with each other, and a cathode 7 is laminated on the electron transport layer 4. The cathode 7 cooperates with the anode 2 opposed thereto to apply an electric field to the junction of the hole transport layer 3 and the electron transport layer 4. More specifically, the cathode 7 injects electrons into the electron transport layer 4 having an electron transporting property, whereas the anode 2 injects holes into the hole transport layer 3 having a hole transporting property.

Figure 3:
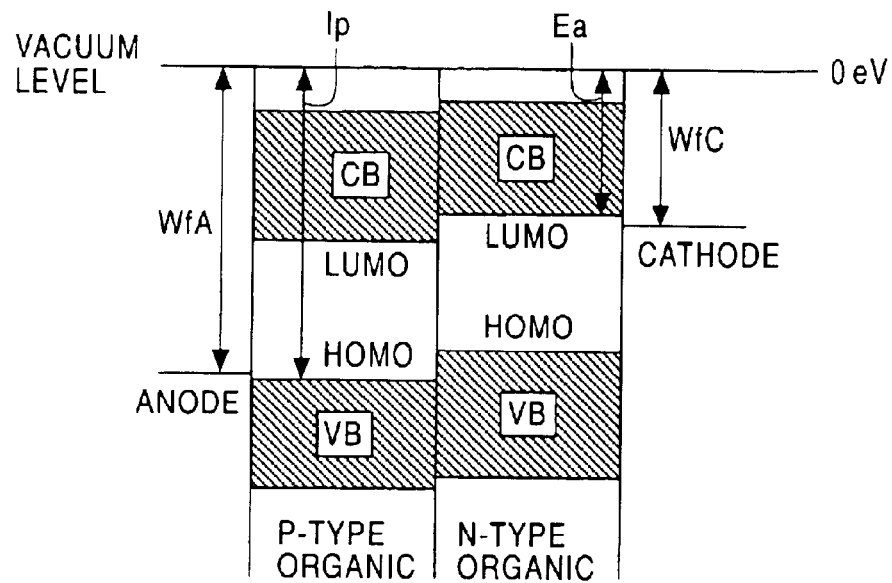
FIG. 3 is a diagram showing energy levels of an organic semiconductor diode having a two-layer structure.

Further, the organic semiconductor diode 11 is only required to be composed of a hole transport layer on the anode side and an electron transport layer on the cathode side, which are laminated one upon the other. The organic semiconductor diode 11 may have the components laminated on the substrate in the reverse order to that of the example illustrated in FIG. 2, that is, in the order of the cathode, the electron transport layer, the hole transport layer, and the anode. The hole transport layer is formed of an organic compound having a hole transport capability, and the electron transport layer is formed of an organic compound having an electron transport capability. The ionization potential of the hole transport layer on the anode side is larger than the electron affinity of the electron transport layer on the cathode side. The hole transport layer and the electron transport layer can be constructed such that they have multi-layer structures formed by thin films of organic compounds having a hole transport capability and an electron transport capability, respectively. The organic semiconductor diode exhibits nonlinear current-voltage characteristics when a voltage is applied between the hole transport layer and the electron transport layer in contact with each other. The cathode has a work function close to or smaller than the electron affinity of the electron transport layer, while the anode has a work function larger than that of the cathode. It should be noted that as shown in FIG. 3, the electron affinity Ea is an energy measured from a vacuum level as the reference energy level of 0 eV to a lowest unoccupied molecular orbital (LUMO) level at a lower edge of a conduction band CB. The ionization potential Ip is an energy value measured from the vacuum level to a highest occupied molecular orbital (HOMO) level at an upper edge of a valence electron band VB. The work functions WfA and WfC at the respective anode and cathode are energies measured from the vacuum level (0 eV) to respective Fermi levels, concerning a metal material and a metal oxide material.

It is preferred that an anode material (ANODE) used for the organic semiconductor diode according to the present invention has a work function WfA as high as possible. For instance, it is preferable to use gold, platinum, palladium, indium tin oxide (hereinafter referred to as "ITO"), iridium zinc oxide, zinc oxide, or an alloy of selected ones of these metals, or further tin oxide, selenium, copper iodide or nickel, each of which has a work function of 4.5 eV or more. Further, it is also possible to employ a conductive polymer, such as poly (3-methylthiophene), polyphenylene sulfide, or polyaniline. These materials can be used separately or by laminating two or more kinds of them one upon the other, for instance, by laminating a polyaniline film on ITO.

On the other hand, as a cathode material (CATHODE), there is used a metal or a compound having a low work function WfC, for instance, analkalimetal, such as silver, lead, tin, aluminum, calcium, indium, chromium, or lithium, an alkaline-earth metal, such as magnesium, or an alloy of selected ones of these metals, or further an alkali metal compound, or an alkaline-earth metal compound, each of which has a work function lower than 4.5 eV.

Figure 4:
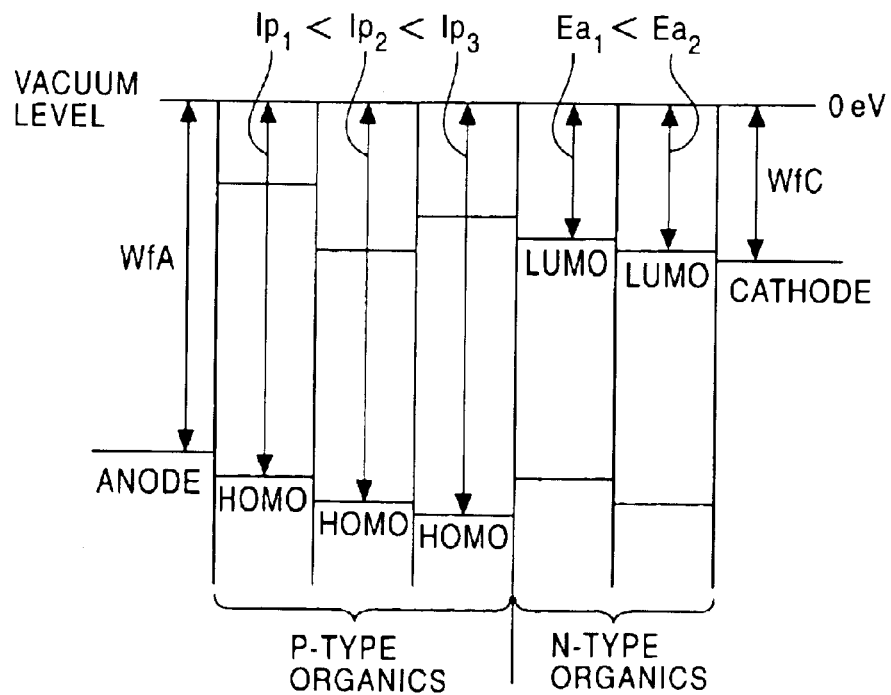
FIG. 4 is a diagram showing energy levels of an organic semiconductor diode having a multi-layer structure.

The electron transport material of the electron transport layer, which has an electron transport capability, is selected from organic compounds represented by the following formulas (1) to (35). When the electron transport layer is configured to have a multi-layer structure, as shown in FIG. 4, the electron transport material (N-TYPE ORGANICS) is selected such that a layer of the material closer to the interface between the electron transport layers and the hole transport layers has a smaller electron affinity Ea (Ea1<Ea2). In other words, out of two electron transport layers adjacent to each other, an electron transport layer on the cathode side has a larger electron affinity than that of an electron transport layer on the anode side.

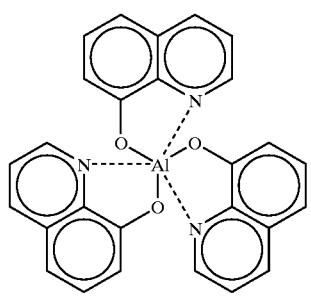

(1)

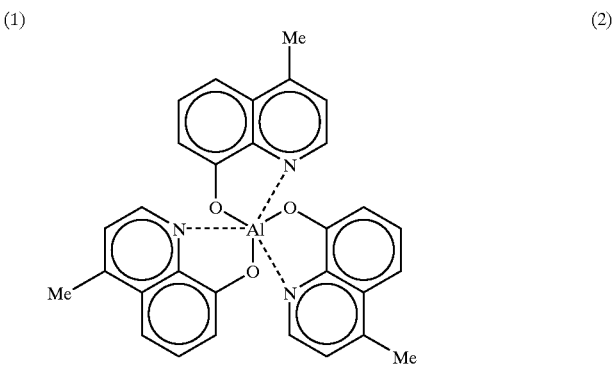

(2)

-continued
(3)
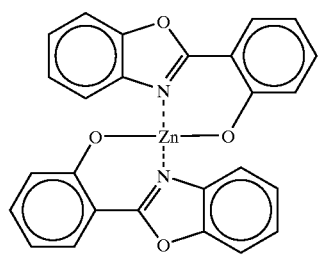
(4)
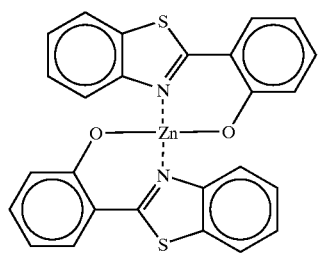
(5)
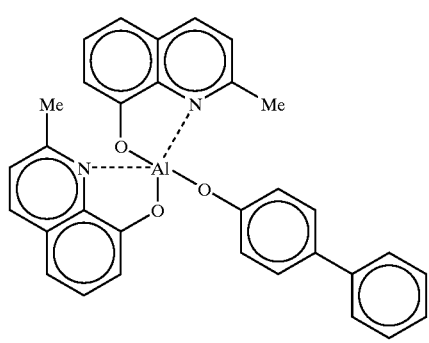
(6)
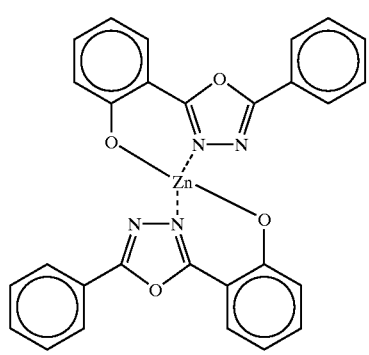
(7)
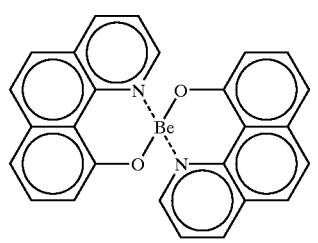
(8)
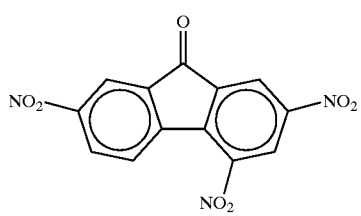
(9)
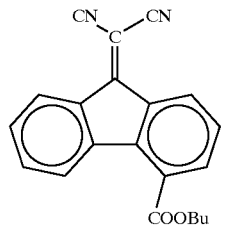
(10)
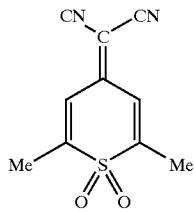
(11)
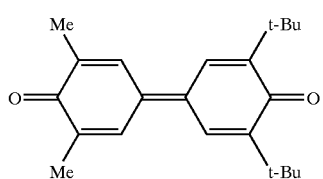
(12)
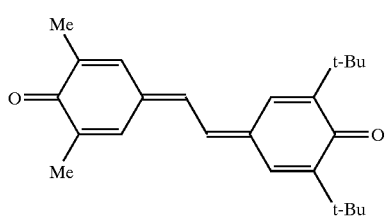
(13)
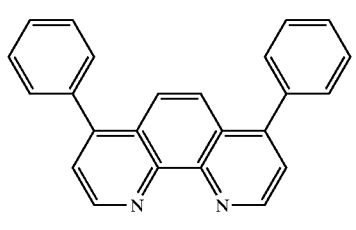
(14)
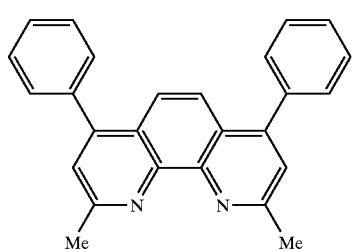

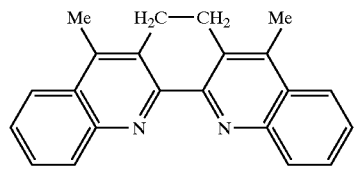
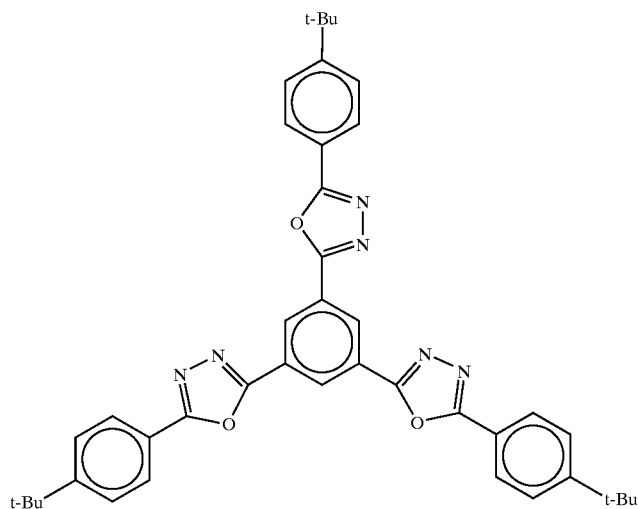
(15)
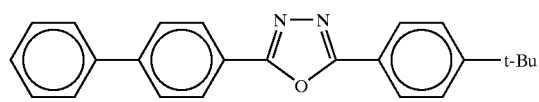
(17)
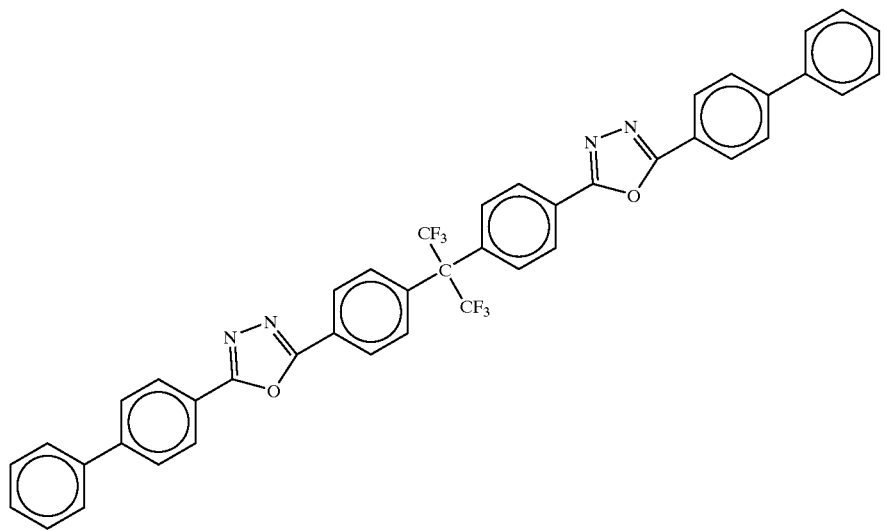
(18)

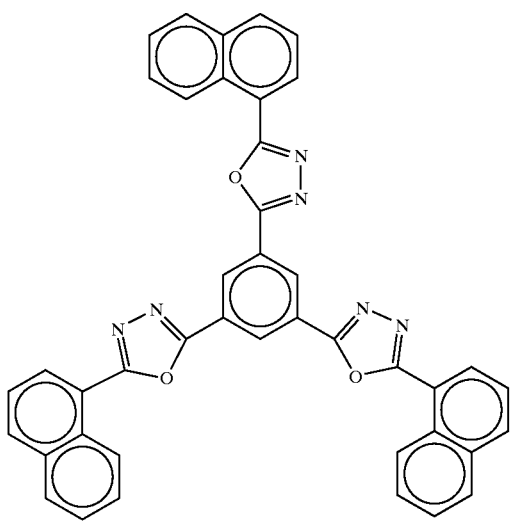
(19)
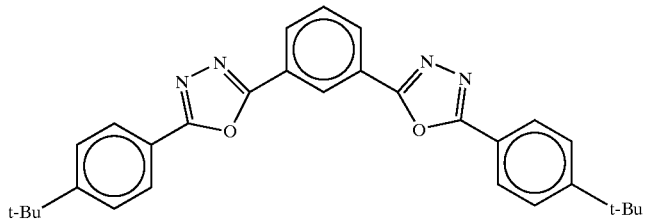
(20)
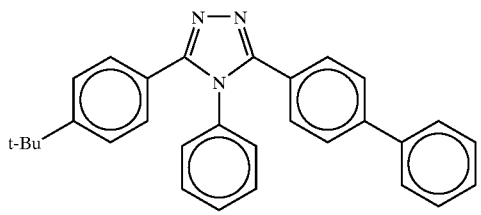
(21)
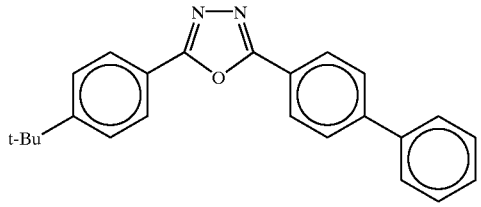
(22)
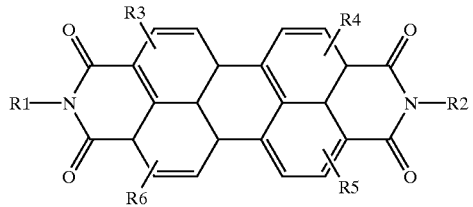
(23)
wherein R1 to R6 each independently represent hydrogen, an alkyl or alkoxy group having a carbon number of 1 to 12, an aryl or aryloxy group having a carbon number of 6 to 14, a heterocyclic compound group, a cyano group, a halogen group, a halogenated alkyl group, or a nitro group.
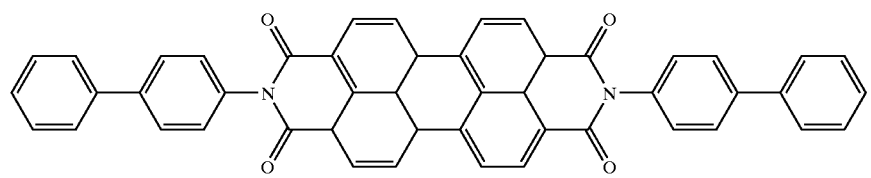
(24)

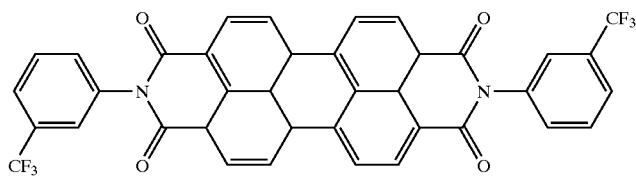
(25)
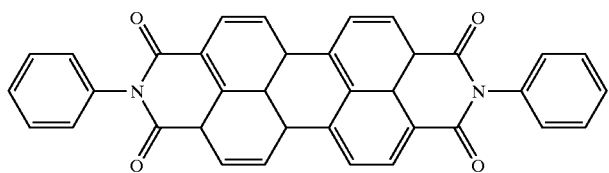
(26)
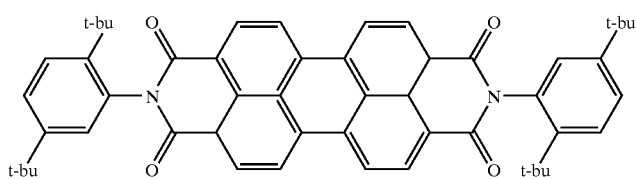
(27)
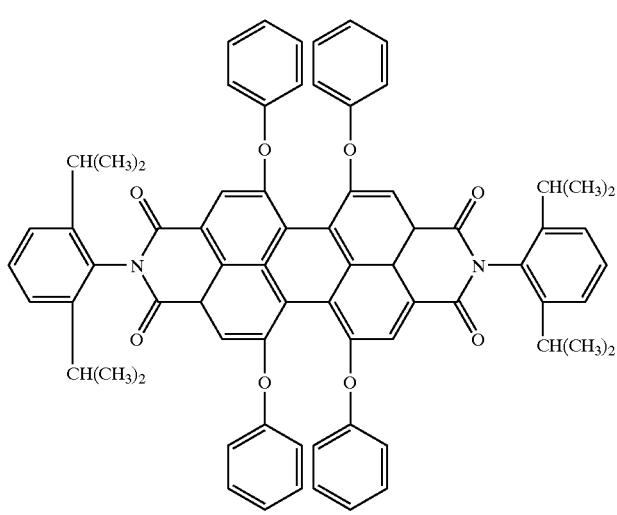
(28)
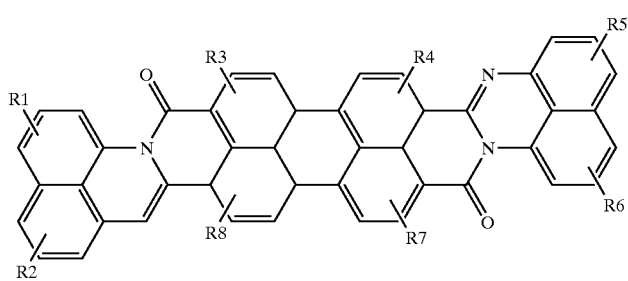
(29)

wherein R1 to R8 each independently represent hydrogen, an alkyl or alkoxy group having a carbon number of 1 to 12, an aryl or aryloxy group having a carbon number of 6 to 14, a heterocyclic compound group, a cyano group, a halogen group, a halogenated alkyl group, or a nitro group.

(30)

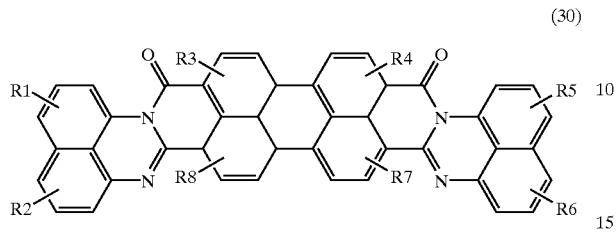

wherein R1 to R8 each independently represent hydrogen, an alkyl or alkoxy group having a carbon number of 1 to 12, an aryl or aryloxy group having a carbon number of 6 to 14, a heterocyclic compound group, a cyano group, a halogen group, a halogenated alkyl group, or a nitro group.

(31)

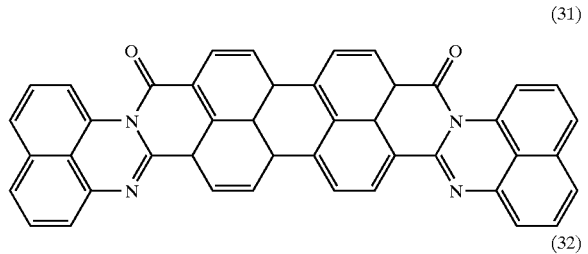

(32)

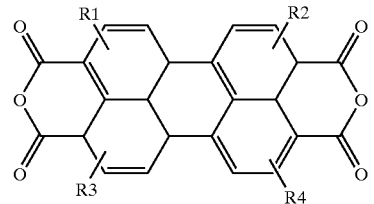

wherein R1 to R4 each independently represent hydrogen, an alkyl or alkoxy group having a carbon number of 1 to 12, an aryl or aryloxy group having a carbon number of 6 to 14, a heterocyclic compound group, a cyano group, a halogen group, a halogenated alkyl group, or a nitro group.

(33)

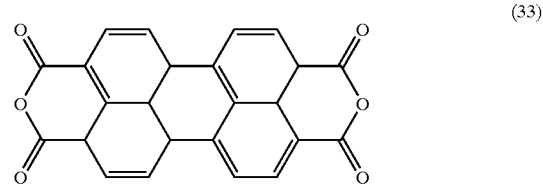

(34)

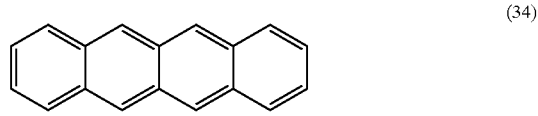

(35)

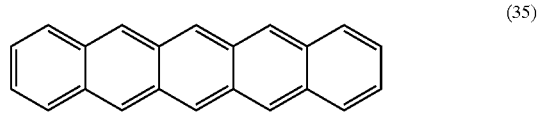

Further, condensed ring compounds, such as a perylene derivative or the like, shown in the above formulas (23) to (35) are preferably used as materials having an electron transport capability, of the electron transport layer.

The hole transport material of the hole transport layer, which has a hole transport capability, is selected from organic compounds represented by the following formulas (36) to (64). When the hole transport layer is configured to have a multi-layer structure, as shown in FIG. 4, the hole transport material (P-TYPE ORGANICS) is selected such that a layer of the material closer to the interface between the hole transport layers and the electron transport layers has a higher ionization potential Ip (Ip1<Ip2<Ip3). In other words, out of two hole transport layers adjacent to each other, a hole transport layer on the anode side has a smaller ionization potential than that of a hole transport layer on the cathode side.

(36)

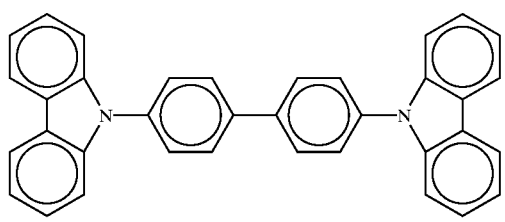

(37)

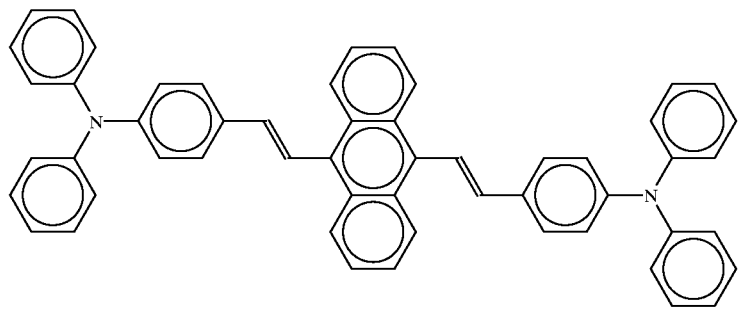

-continued
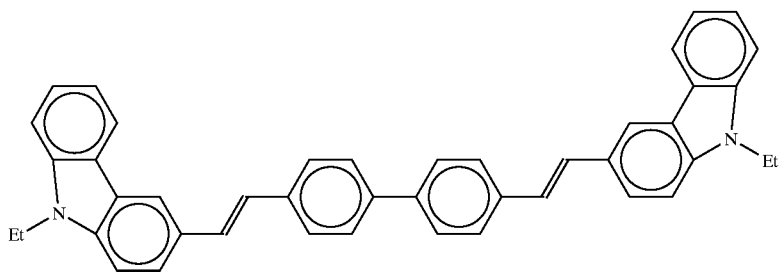
(38)
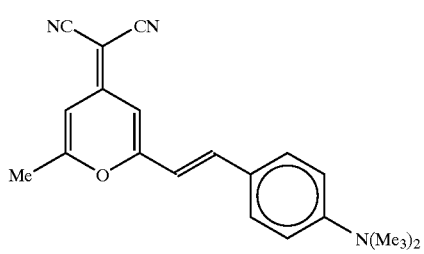
(39)
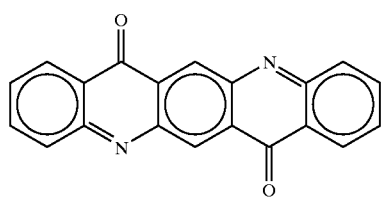
(40)
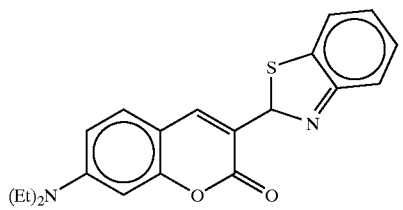
(41)
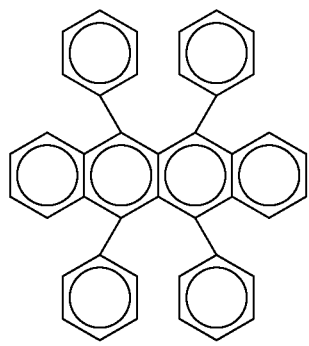
(42)
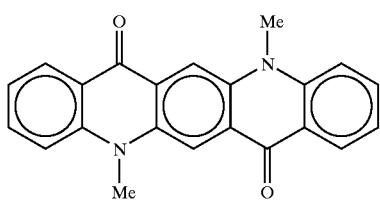
(43)
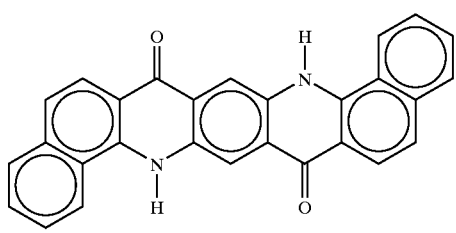
(44)
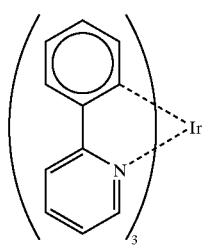
(45)

-continued
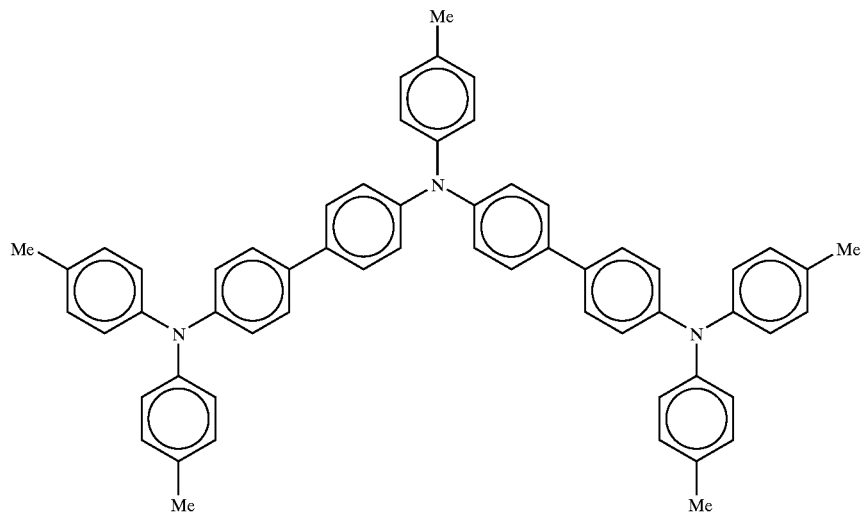
(46)
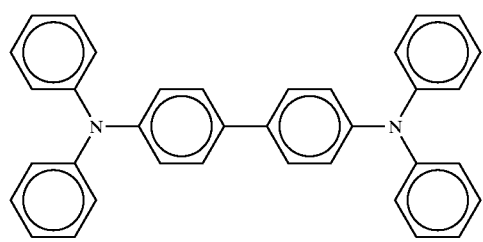
(47)
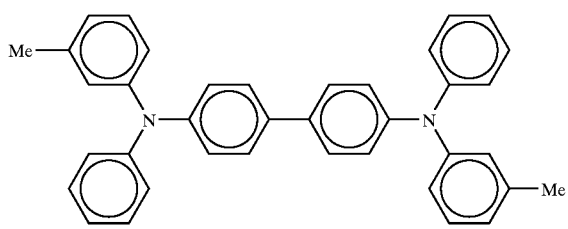
(48)
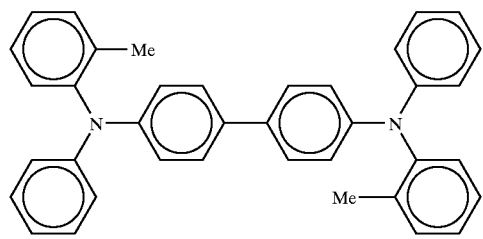
(49)
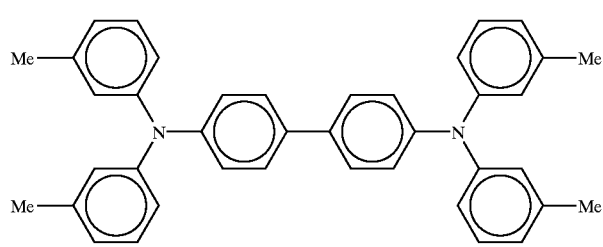
(50)
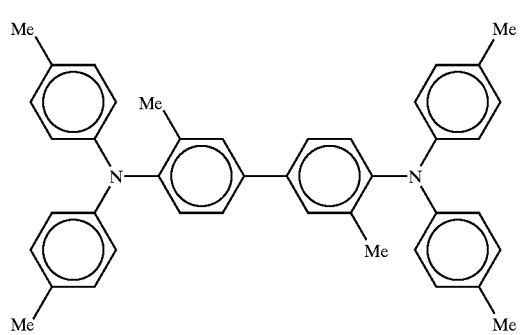
(51)

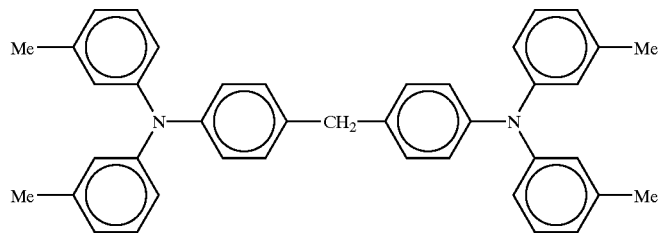
(52)
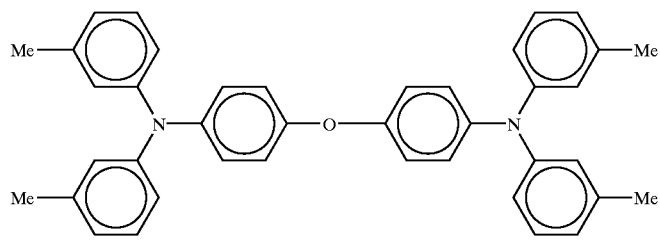
(53)
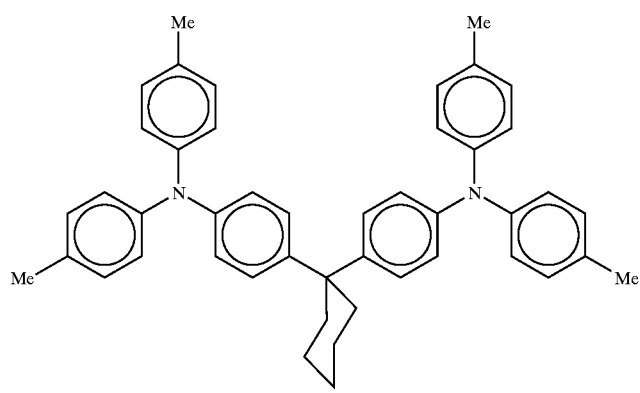
(54)
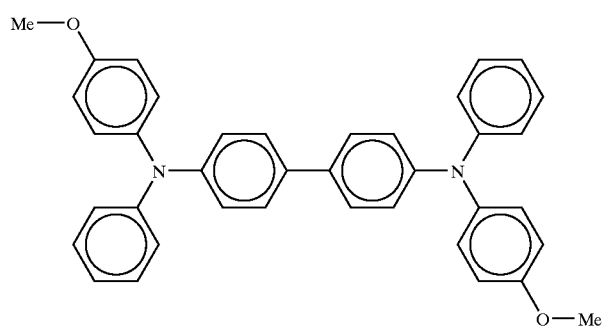
(55)
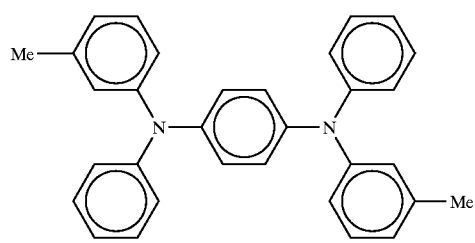
(56)
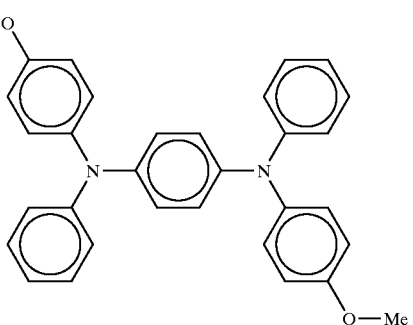
(57)

-continued

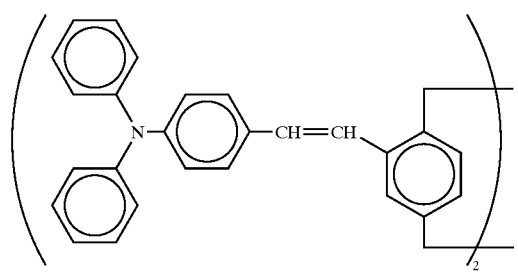
(58)

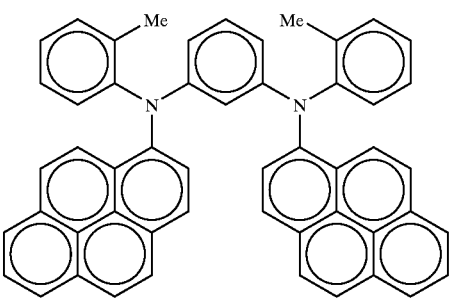
(59)

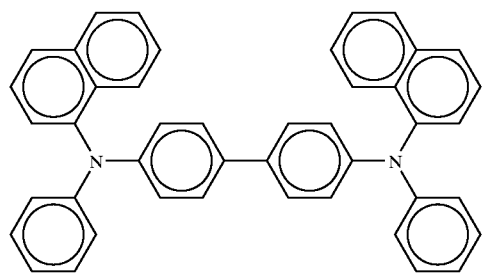
(60)

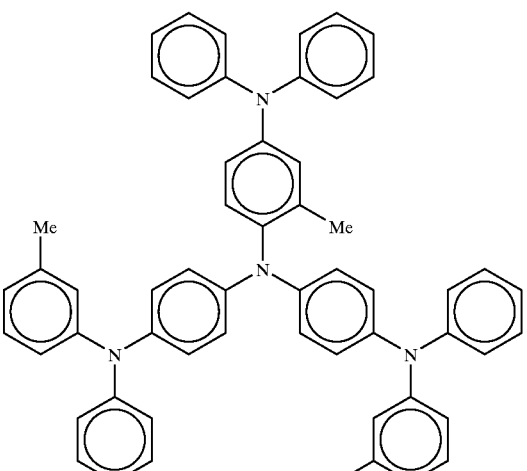
(61)

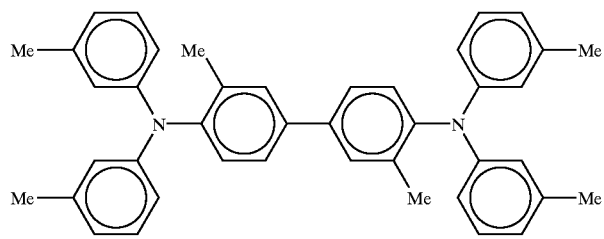
(62)

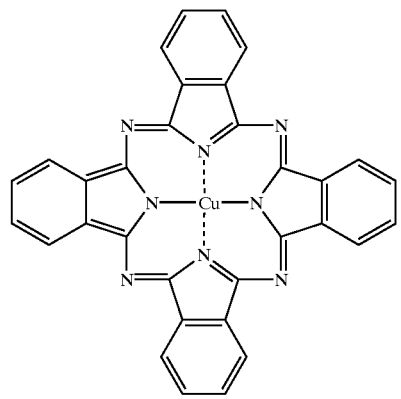
(63)

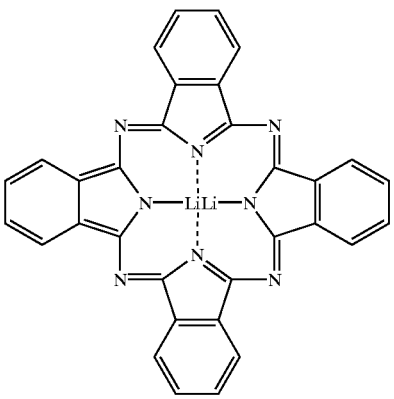
(64)

It should be noted that in the above formulas (1) to (64), Me designates a methyl group, Et designates an ethyl group, Bu designates a butyl group, and t-Bu designates a tertiary butyl group.

The formula (63) represents copper phthalocyanine, that is called CuPc, having a hole transport capability, which is included in porphyrin derivatives. The porphyrin derivatives include the following materials which can be employed as hole transport layers:

porphine,
1,10,15,20-tetraphenyl-21H,23H-porphine copper (II),
1,10,15,20-tetraphenyl-21H,23H-porphine zinc (II),
5,10,15,20-tetrakis(pentafluorophenyl)-21H,23H-porphine, silicon phthalocyanine oxide,
aluminum phthalocyanine chloride,
phthalocyanine (metal-free),
dilithium phthalocyanine,
copper tetramethyl phthalocyanine,
chromium phthalocyanine,
zinc phthalocyanine,
lead phthalocyanine,
titanium phthalocyanine oxide,
magnesium phthalocyanine,
copper octamethyl phthalocyanine
chromium phthalocyanine fluoride.

It should be noted that a material other than the compounds represented by the above-mentioned formulas may be included in the hole transport layer or the electron transport layer. For instance, the layers may be doped with a fluorescence material or a phosphorescence material. Further, they may be doped with an inorganic or organic material for enhancing the carrier density of each layer.

Further, the hole transport layer or the electron transport layer may be formed by co-deposition as a mixture layer composed of a plurality of materials each of which is formed of an organic compound and has a transport capability. Further, the hole transport layer or the electron transport layer may be configured to have one or more mixture layers.

The hole transport layer and the electron transport layer each composed of an organic compound are kinds of semiconductors which can be regarded as a p-type organic semiconductor material and an n-type organic semiconductor material (hereinafter also simply referred to as "the p-type material" and "the n-type material"), respectively. The inventors have found that it is possible to properly form an organic p-n junction by taking into account the electron affinity, ionization potential, electron energy band gap, Fermi level, and (carrier) mobility of each of the above organic transport materials as well as the thickness of each of thin films of the organic compounds, and obtain an organic semiconductor diode by using such an organic p-n junction.

The electrical characteristics of laminate layers of thin films made of the above organic compounds different in electrical characteristics, that is, the electrical characteristics of the junction interface depend on the ionization potential, electron energy band gap, Fermi level and carrier mobility, and work functions at the anode and cathode, of each organic thin film layer, and determine the characteristics of the element itself. The organic p-n junction is formed by laminating two kinds of adjacent organic compound thin films different in energy band gap, one upon the other. During thermal equilibrium, the two kinds of organic compound materials have constant Fermi levels as a whole. The thermal equilibrium is achieved by diffusion of the carriers of free electrons and holes through the junction interface, and as a result, an inner electric field is generated within the junction. The inner electric field causes the vacuum level to move, and the end of the energy band to bend. An inner electric field generated between the conduction bands of the p-type material and the n-type organic material serves as a potential barrier for preventing electrons oozing out of the region of the n-type material from moving into the region of the p-type material. Further, an inner electric field generated between the valence bands of the same serves as another potential barrier for preventing holes from moving from the region of the p-type material to the region of the n-type material.

When a forward bias voltage is applied to the organic p-n junction, electrons are injected from the cathode into the n-type material whereas holes are injected from the anode into the p-type material.

The injected electrons and holes are accumulated on the junction interface. When the bias voltage exceeds a predetermined threshold, the electrons overcome the potential barrier to move from the region of the n-type material of the p-n junction into the region of the p-type material of the same, and are diffused and recombined with the holes to be lost. The injection of these carriers causes a current to flow to an external circuit e.g. of the organic EL element.

If at least one of the hole transport layer and the electron transport layer is configured to have a multi-layer structure, since electrons move toward a lower energy level, the electrons injected from the cathode sequentially travel via the lowest unoccupied molecular orbital (LUMO) level of each of the electron transport layers made of the n-type materials to reach a hole transport layer made of the p-type material. On the other hand, since holes move toward a higher energy level, the holes injected from the anode sequentially travel via the highest occupied molecular orbital (HOMO) level of each of the hole transport layers made of the p-type materials to reach an electron transport layer made of the n-type material. Accordingly, when the hole transport layer is configured to have a multi-layer structure, the p-type materials of respective hole transport layers are selected such that a layer closer to the anode has a smaller ionization potential. Further, when the electron transport layer is configured to have a multi-layer structure, the n-type materials of respective electron transport layers are selected such that a layer closer to the cathode has a larger electron affinity.

The thin films of the p-type organic semiconductor and n-type organic semiconductor which form the p-n junction and are used in the organic semiconductor diode according to the present invention can be formed by a well-known method, such as a vacuum vapor deposition method, a spin-coating method, a sputtering method, or a sol-gel method. The thickness of each organic semiconductor thin film is preferably 500 nm or less, and more preferably, 10 to 200 nm. Therefore, the thickness of an organic p-n junction is only required to be 1000 nm or less, and preferably 1 to 500 nm, and more preferably 20 to 400 nm.

In the organic semiconductor diode element according to the present invention, there is not used an inorganic insulating material which requires a high temperature process, so that the element can be manufactured at a relatively low temperature, and is suitable for control of organic functional elements, such as current control of organic EL elements, or the like.

As examples, organic semiconductor diodes are made by using a porphyrin derivative for a hole transport layer and a perylene derivative for an electron transport layer, and the characteristics of the diode are evaluated.

EXAMPLE 1

Thin films defined as described below were laminated on a glass substrate which is formed with an anode made of an ITO film having a film thickness of 1100 Å, by the vacuum vapor deposition method at a vacuum level of $5.0 \times 10^{-6}$ Torr.

First, a thin film of the above-mentioned CuPc was formed on the ITO layer as a hole transport layer at a vapor deposition rate of 3 Å/sec. to have a thickness of 50 nm.

Then, a thin film of a perylene derivative represented by the formula (25) was formed on the hole transport layer as an electron transport layer at a vapor deposition rate of 3 Å/sec. to have a thickness of 50 nm.

Further, a thin film of aluminum (Al) was laminated as a cathode at a vapor deposition rate of 10 Å/sec. to have a thickness of 100 nm, to thereby complete the preparation of the organic semiconductor diode.

COMPARATIVE 1

Comparative organic semiconductor diodes were prepared, each of which is identical to Example 1 except that a two-layered anode was used in place of the ITO anode of a single layer. The two-layered anode was formed such that the ITO layer was coated with aluminum (Al), so that the CuPc was formed on the Al layer.

Figure 5:
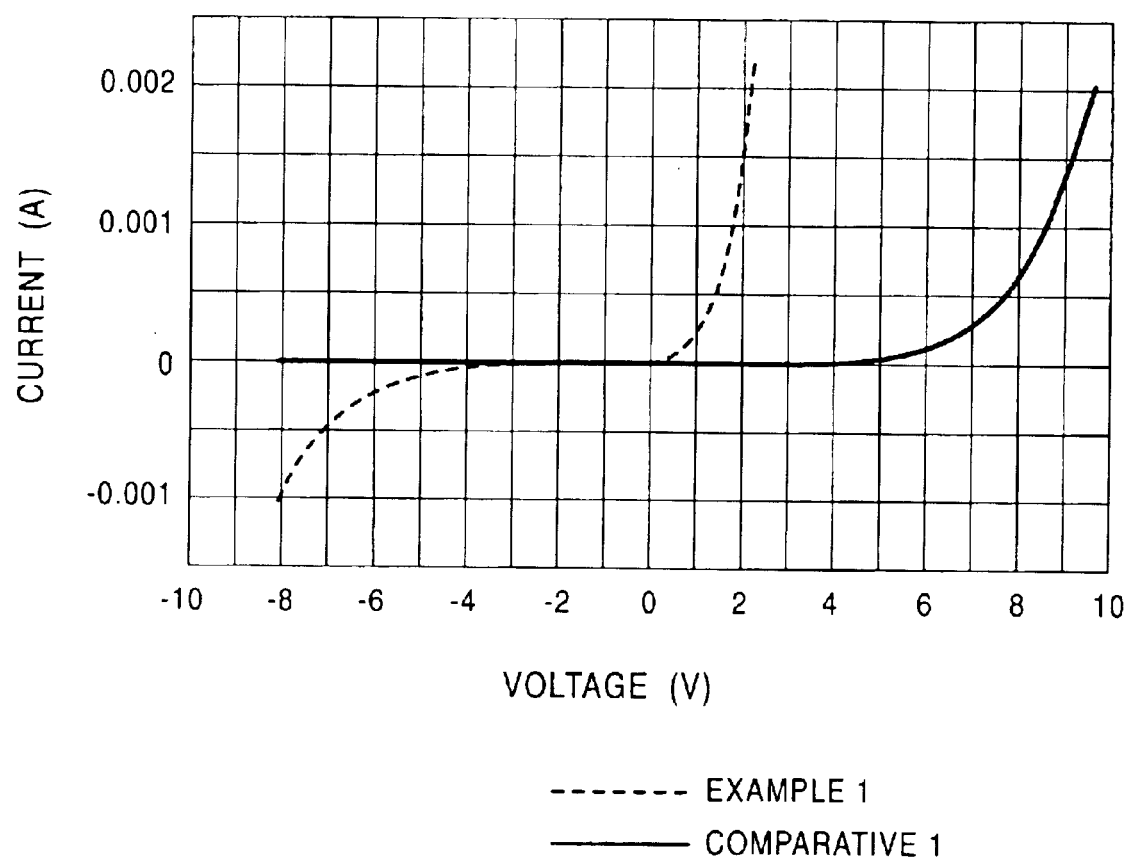
FIG. 5 is a graph showing the current-voltage characteristics of an organic semiconductor diode according to an embodiment of the present invention.

When the example and comparative organic semiconductor diodes obtained as above were each driven at a fixed current value of 0.1 mA/mm$^2$, current-voltage characteristics indicated by respective curved lines in FIG. 5 were exhibited.

EXAMPLE 2

Thin films defined as described below were laminated on a glass substrate which is formed with an anode made of an ITO film having a film thickness of 1100 Å, by the vacuum vapor deposition method at a vacuum level of $5.0 \times 10^{-6}$ Torr.

First, a thin film of the above-mentioned CuPc was formed on the ITO layer as a hole transport layer at a vapor deposition rate of 3 Å/sec. to have a thickness of 50 nm.

Then, a thin film of a perylene derivative represented by the formula (26) was formed on the hole transport layer as an electron transport layer at a vapor deposition rate of 3 Å/sec. to have a thickness of 50 nm.

Further, a thin film of lithium oxide (LiO$_2$) was deposited on the electron transport layer as a cathode at a vapor deposition rate of 1 Å/sec. such that the LiO$_2$ thin film layer has a thickness of 0.5 nm, and further on the LiO$_2$ thin film layer, a thin film of aluminum (Al) was laminated as an auxiliary electrode at a vapor deposition rate of 10 Å/sec. such that the Al thin film layer has a thickness of 100 nm, to thereby complete the preparation of the organic semiconductor diode.

COMPARATIVE 2

Comparative organic semiconductor diodes were prepared, each of which is identical to Example 2 except that the auxiliary electrode as a cathode was used without LiO$_2$ thin film.

Figure 6:
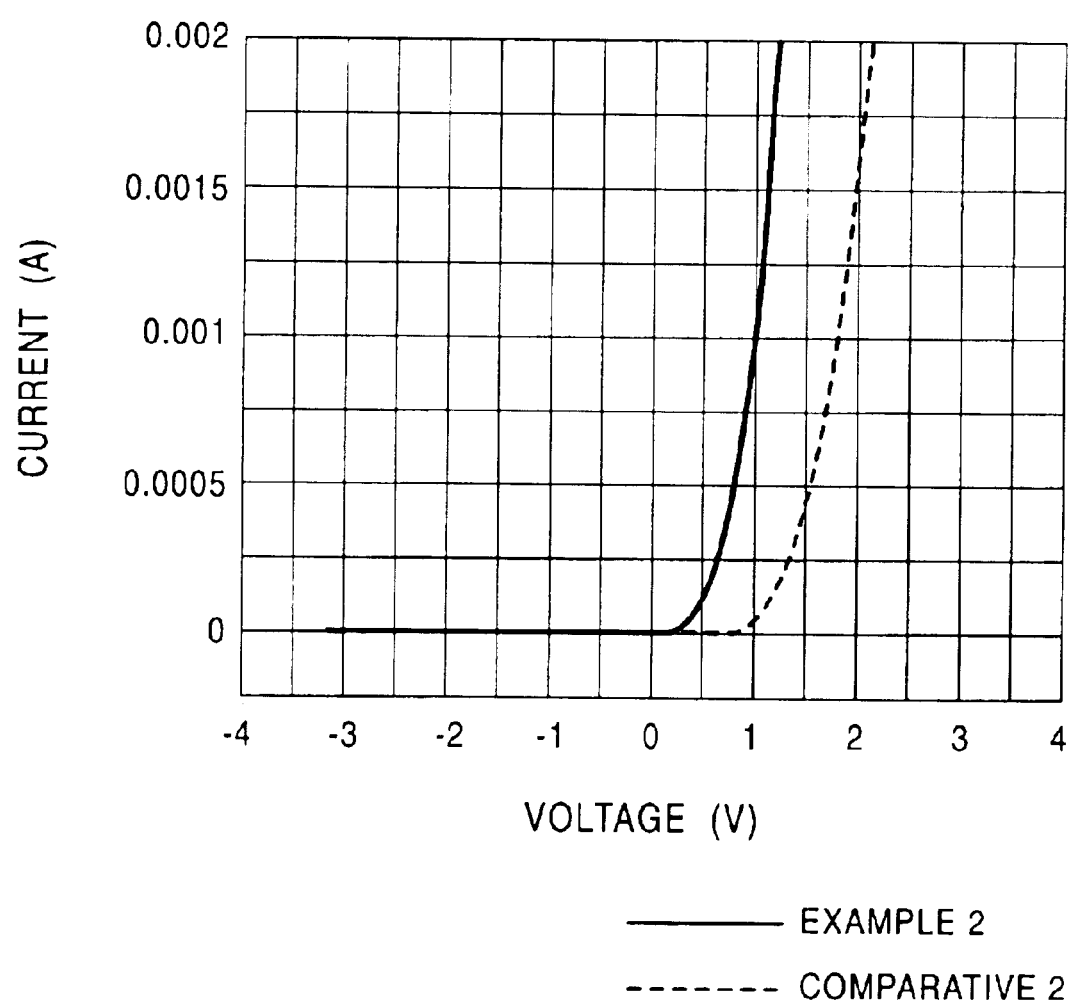
FIG. 6 is a graph showing the current-voltage characteristics of an organic semiconductor diode according to another embodiment of the present invention.

When the example and comparative organic semiconductor diodes obtained as above were each driven at a fixed current value of 0.1 mA/mm$^2$, current-voltage characteristics indicated by respective curved lines in FIG. 6 were exhibited. As seen from FIGS. 5 and 6, it can be understood that when a voltage is applied between the hole transport layer and the electron transport layer of the organic semiconductor diode in contact with each other, it is possible to obtain excellent rectification characteristics, i.e. nonlinear current-voltage characteristics in the concessions that the cathode has a work function close to or smaller than the electron affinity of the electron transport layer, while the anode has a work function larger than that of the cathode.

As described hereinabove, according to the present invention, it is possible to obtain organic semiconductor diodes which can be manufactured by a low temperature process. By combining organic EL elements and organic semiconductor diodes, a display panel can be produced by an organic thin film-laminating process alone. Since diode elements can be formed by organic thin films without using a silicon substrate, a large-sized full color display of an organic EL element display device based on the matrix driving method can be manufactured by a simple process for manufacturing an organic EL panel.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2001-87132 which is hereby incorporated by reference.

What is claimed is:

1. An organic semiconductor diode comprising:

an anode and a cathode;

a p-type organic semiconductor material layer which is arranged on the anode and formed of an organic compound having a hole transport capability and an ionization potential;

an n-type organic semiconductor material layer which is arranged on the cathode and formed of an organic compound having an electron transport capability and an electron affinity; and a junction of the p-type and n-type organic semiconductor material layers resulting from the p-type and n-type organic semiconductor material layers being laminated one upon another between the anode and the cathode so that the ionization potential of the p-type organic semiconductor material layer is larger than the electron affinity of the n-type organic semiconductor material layer, wherein the junction of the p-type and n-type organic semiconductor material layers has nonlinear current-voltage characteristics without light emission when a voltage is applied across the anode and cathode.

2. The organic semiconductor diode according to claim 1, wherein the anode has a work function larger than that of the cathode.

3. The organic semiconductor diode according to claim 1, wherein the cathode has a work function close to or smaller than the electron affinity of the n-type organic semiconductor material layer.

4. The organic semiconductor diode according to claim 1, wherein the anode has a work function close to or larger than the ionization potential of the p-type organic semiconductor material layer.

5. The organic semiconductor diode according to claim 1, wherein the p-type organic semiconductor material layer is constructed to have a multi-layer structure formed with layered thin films of organic compounds each having a hole transport capability, and in every pair of thin films in contact with each other, the thin film on the anode side of the pair has a smaller ionization potential than that of the thin film on the junction side of the pair.

6. The organic semiconductor diode according to claim 1, wherein the n-type organic semiconductor material layer is constructed to have a multi-layer structure formed with layered thin films of organic compounds each having an electron transport capability, and in every pair of thin films in contact with each other, the thin film on the cathode side of the pair has a larger electron affinity than that of the thin film on the junction side of the pair.

7. An organic electroluminescence element display panel comprising:
   a common substrate;
   organic electroluminescence elements formed on the common substrate; and
   organic semiconductor diodes to be combined with the organic electroluminescence elements with respect to the common substrate,
   wherein the organic semiconductor diode comprises:
     an anode and a cathode;
     a p-type organic semiconductor material layer which is arranged on the anode and formed of an organic compound having a hole transport capability and an ionization potential;
     an n-type organic semiconductor material layer which is arranged on the cathode and formed of an organic compound having an electron transport capability and an electron affinity; and
     a junction of the p-type and n-type organic semiconductor material layers resulting from the p-type and n-type organic semiconductor material layers being laminated one upon another between the anode and the cathode so that the ionization potential of the p-type organic semiconductor material layer is larger than the electron affinity of the n-type organic semiconductor material layer,
   wherein the junction of the p-type and n-type organic semiconductor material layers has nonlinear current-voltage characteristics without light emission when a voltage is applied across the anode and cathode.

8. The organic electroluminescence element display panel according to claim 7, wherein the anode has a work function larger than that of the cathode.

9. The organic electroluminescence element display panel according to claim 7, wherein the cathode has a work function close to or smaller than the electron affinity of the n-type organic semiconductor layer.

10. The organic electroluminescence element display panel according to claim 7, wherein the anode has a work function close to or larger than the ionization potential of the p-type organic semiconductor material layer.

11. The organic electroluminescence element display panel according to claim 7, wherein the p-type organic semiconductor material layer is constructed to have a multi-layer structure formed with layered thin films of organic compounds each having a hole transport capability, and in every pair of thin films in contact with each other, the thin film on the anode side of the pair has a smaller ionization potential than that of the thin film on the junction side of the pair.

12. The organic electroluminescence element display panel according to claim 7, wherein the n-type organic semiconductor material layer is constructed to have a multi-layer structure formed with layered thin films of organic compounds each having an electron transport capability, and in every pair of thin films in contact with each other, the thin film on the cathode side of the pair has a larger electron affinity than that of the thin film on the junction side of the pair.

* * * * *